(12) United States Patent
Zhang et al.

(10) Patent No.: US 12,041,400 B2
(45) Date of Patent: Jul. 16, 2024

(54) ACOUSTIC DEVICE AND ELECTRONIC APPARATUS

(71) Applicant: Goertek Inc., Shandong (CN)

(72) Inventors: Cuili Zhang, Shandong (CN); Feng Zhang, Shandong (CN); Guoqiang Chen, Shandong (CN); He Liang, Shandong (CN); Jianxin Wang, Shandong (CN)

(73) Assignee: Goertek. Inc., Shandong (CN)

( * ) Notice: Subject to any disclaimer, the term of this patent is extended or adjusted under 35 U.S.C. 154(b) by 233 days.

(21) Appl. No.: 17/624,158

(22) PCT Filed: Dec. 30, 2019

(86) PCT No.: PCT/CN2019/129862
§ 371 (c)(1),
(2) Date: Dec. 30, 2021

(87) PCT Pub. No.: WO2021/051712
PCT Pub. Date: Mar. 25, 2021

(65) Prior Publication Data
US 2022/0369009 A1 Nov. 17, 2022

(30) Foreign Application Priority Data
Sep. 17, 2019 (CN) .......................... 201910878029.2

(51) Int. Cl.
H04R 25/00 (2006.01)
H01Q 1/24 (2006.01)
H04R 1/02 (2006.01)
H04R 9/02 (2006.01)
H04R 9/04 (2006.01)
(Continued)

(52) U.S. Cl.
CPC ............. *H04R 1/023* (2013.01); *H01Q 1/243* (2013.01); *H04R 9/027* (2013.01); *H04R 9/046* (2013.01); *H04R 9/06* (2013.01); *H05K 9/0081* (2013.01); *H04R 2499/11* (2013.01)

(58) Field of Classification Search
CPC ........ H04R 17/00; H04R 1/028; H04R 1/023; H04R 1/026
See application file for complete search history.

(56) References Cited

U.S. PATENT DOCUMENTS

| 2006/0019734 | A1* | 1/2006 | Roemer | G07F 17/32 463/16 |
| 2007/0004484 | A1* | 1/2007 | Imura | G07F 17/32 463/7 |
| 2016/0173991 | A1* | 6/2016 | Mima | H04R 17/00 381/151 |

FOREIGN PATENT DOCUMENTS

| CN | 204145746 U | 2/2015 |
| CN | 204180267 U | 2/2015 |
| CN | 207382731 U | 5/2018 |

* cited by examiner

*Primary Examiner* — Amir H Etesam
(74) *Attorney, Agent, or Firm* — Baker Botts LLP

(57) ABSTRACT

An acoustic device comprises a shell and a sound producing assembly, the shell being provided with an installation hole and a sound outlet, and the sound producing assembly being fixed inside the shell. The sound producing assembly has a diaphragm separating a cavity of the acoustic device into a front cavity and a back cavity, a first part of the shell corresponding to the front cavity and/or a second part of the shell corresponding to the back cavity is provided with sapphire glass covering the installation hole, and the front cavity is in communication with the outside of the acoustic device through the sound outlet.

10 Claims, 2 Drawing Sheets

(51) Int. Cl.
*H04R 9/06* (2006.01)
*H05K 9/00* (2006.01)

ACOUSTIC DEVICE AND ELECTRONIC APPARATUS

CROSS-REFERENCE TO RELATED APPLICATIONS

This application is a National Stage of International Application No. PCT/CN2019/129862, filed on Dec. 30, 2019, which claims priority to Chinese Patent Application No. 201910878029.2 filed on Sep. 17, 2019, both of which are hereby incorporated by reference in their entireties.

TECHNICAL FIELD

The present disclosure relates to the field of acoustic technologies, and in particular to an acoustic device and an electronic apparatus installed with the acoustic device.

BACKGROUND

In recent years, mobile terminal products are becoming thinner and thinner. Such miniaturization demand cannot be satisfied with a traditional acoustic device. In order to realize a miniaturized mobile terminal product and increase the volume of its cavity, there is a need for reducing the thickness of a cover plate. In the prior art, a metal steel sheet, instead of previously used plastic ones, is typically used in combination with the shell of the acoustic device.

With the development of 5G technology, technologies such as the 5G network have also been gradually applied to mobile terminals such as mobile phones. The antenna of a 5G mobile phone is sensitive to the surrounding medium, and the bandwidth thereof is affected by the dielectric constant of the material thereof. In general, the higher the dielectric constant, the stronger the restraint to the field; and the bandwidth correspondingly becomes narrower. Therefore, the lower the dielectric constant of the medium around the antenna, the better. In addition, due to the short wavelength of the millimeter wave, the antennas of a mobile terminal using the 5G technology is susceptible to interference from a metal steel sheet with a high dielectric constant. In order to reduce the influence of the metal steel sheet on the antenna, it is usually necessary to maintain a clearance of 1.5 mm between the antenna and the metal steel sheet of the acoustic device, which occupies a large space in the terminal and thus is not conducive to miniaturization of the mobile terminal.

SUMMARY

The main objective of the present disclosure is provide an acoustic device and an electronic apparatus, which aim to solve the problem of interference of the existing acoustic device on the antenna of a 5G mobile terminal.

In order to achieve the above objective and other objective, the present disclosure provides an acoustic device, comprising:
 a shell provided with an installation hole and a sound outlet;
 a sound producing assembly fixed inside the shell;
 the sound producing assembly has a diaphragm separating the cavity of the acoustic device into a front cavity and a back cavity, wherein the front cavity is in communication with the outside of the acoustic device through the sound outlet, and a first part of the shell corresponding to the front cavity and/or a second part of the shell corresponding to the back cavity is provided with sapphire glass covering the installation hole.

Optionally, the sapphire glass has a thickness of 0.1 mm to 0.3 mm.

Optionally, the sapphire glass has a thickness greater than 0.3 mm and less than or equal to 0.5 mm.

Optionally, the sapphire glass has a Mohs hardness of 9.

Optionally, the sapphire glass has a light transmittance of at least 80%.

Optionally, the first part of the shell corresponding to the front cavity is concaved toward the front cavity to form an installation groove, wherein the installation hole is located at the bottom of the installation groove, and the sapphire glass is installed inside the installation groove.

Optionally, one side of the sapphire glass facing away from the front cavity does not extend beyond a plane where the opening of the installation groove is located.

Optionally, the sapphire glass and the shell are fixed by gluing.

Optionally, the sapphire glass and the shell are bonded and fixed with UV glue.

In order to achieve the above objective and other objective, the present disclosure also provides an electronic apparatus, the electronic apparatus including a housing and an antenna of the electronic apparatus, as well as the above acoustic device.

The technical effect of the present disclosure at least includes: the acoustic device comprises a shell and a sound producing assembly, the shell is provided with an installation hole and a sound outlet, the sound producing assembly is fixed inside the shell, the sound producing assembly has a diaphragm separating the cavity of the acoustic device into a front cavity and a back cavity, a first part of the shell corresponding to the front cavity and/or a second part of the shell corresponding to the back cavity is provided with sapphire glass covering the installation hole, and the front cavity is in communication with the outside of the acoustic device through the sound outlet. As such, the sapphire glass has a small dielectric constant, and therefore has a small impact on the antenna of 5G mobile terminals.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which are incorporated in the description and constitute a part of the description, illustrate embodiments of the present disclosure and, together with the description thereof, serve to explain the principles of the present disclosure.

Figure 1:
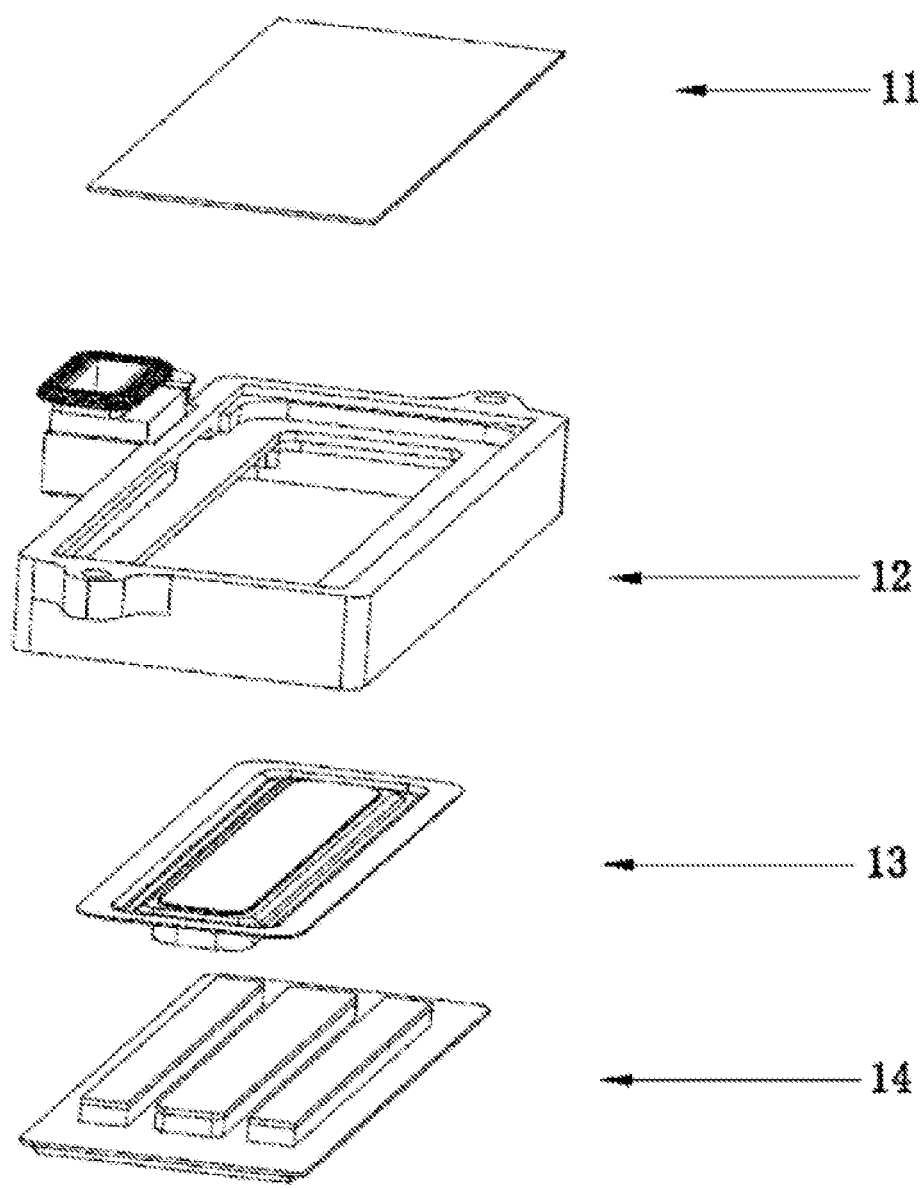
FIG. 1 is an exploded view of an embodiment of the acoustic device of the present disclosure.

DESCRIPTION OF REFERENCE SIGNS 11 sapphire glass, 12 shell, 121 sound outlet, 122 installation groove, 13 vibration assembly, 131 fixing part, 132 corrugated rim, 133 central part, 134 reinforcement part, 135 voice coil, 14 magnetic circuit assembly, 141 magnet yoke, 142 central magnet, 143 side magnet, 144 central concentrating flux plate, 145 side concentrating flux plate.

DETAILED DESCRIPTION

Various exemplary embodiments of the present disclosure will now be described in detail with reference to the accompanying drawings. It should be noted that the relative arrangement, numerical expressions and numerical values of the components and steps set forth in these examples do not limit the scope of the disclosure unless otherwise specified.

The following description of at least one exemplary embodiment is in fact merely illustrative and is in no way intended as a limitation to the present disclosure and its application or use.

Techniques, methods, and apparatus known to those of ordinary skill in the relevant art may not be discussed in detail but where appropriate, the techniques, methods, and apparatus should be considered as part of the description.

Among all the examples shown and discussed herein, any specific value should be construed as merely illustrative and not as a limitation. Thus, other examples of exemplary embodiments may have different values.

It should be noted that similar reference numerals and letters denote similar items in the accompanying drawings, and therefore, once an item is defined in a drawing, and there is no need for further discussion in the subsequent accompanying drawings.

The present disclosure provides an acoustic device for sounding on an electronic apparatus.

Figure 3:
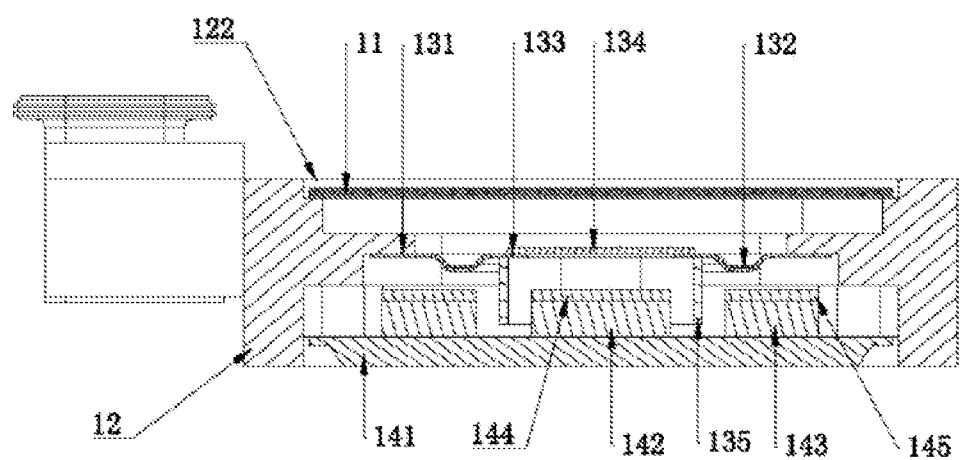
FIG. 3 is a cross-sectional view of the embodiment of the acoustic device of the present disclosure in FIG. 2 along the A-A direction.

As shown in FIGS. 1 and 3, the acoustic device includes a sound generating assembly, wherein the sound generating assembly is a miniature sound generating assembly, and specifically, the sound generating assembly is a miniature moving coil type sound generating assembly. The sound generating assembly includes at least a vibration assembly 13 and a magnetic circuit assembly 14. The vibration assembly 13 includes a diaphragm and a voice coil 135 coupled to the diaphragm. There is a magnetic gap in the magnetic circuit assembly where the voice coil 135 is disposed. The voice coil 135 reciprocates up and down in the magnetic field after being supplied with alternating current, thereby driving the diaphragm to vibrate and produce sound.

Figure 2:
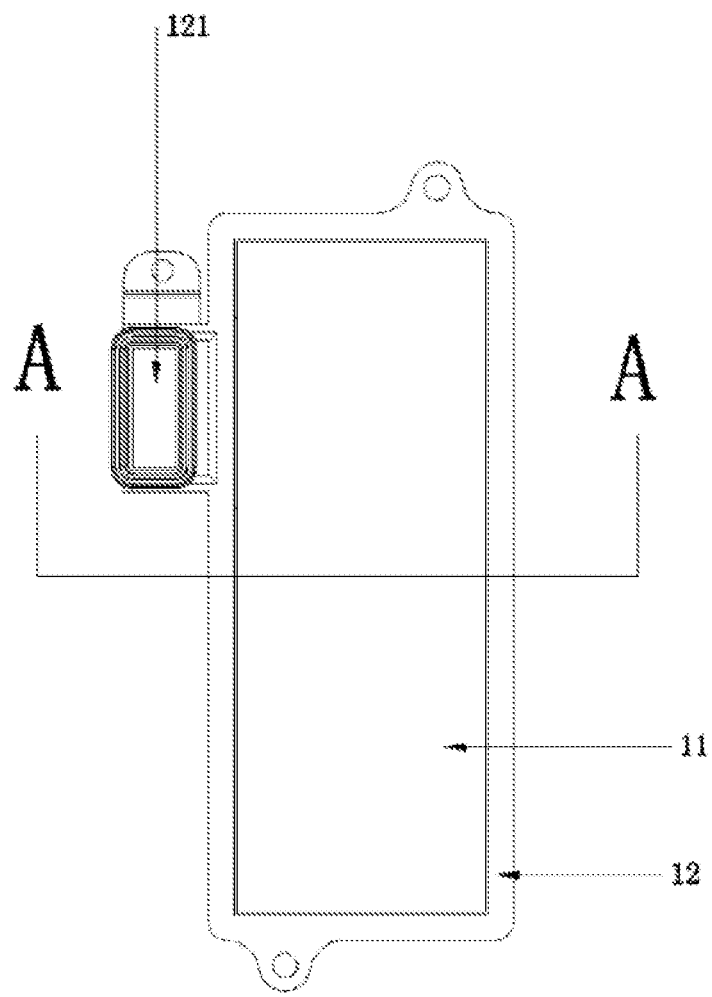
FIG. 2 is a top view of an embodiment of the acoustic device of the present disclosure.

In the present disclosure, as shown in FIG. 2, the acoustic device includes a shell 12 which is provided with an installation hole and a sound outlet 121. The shell 12 may be made of plastic material and is directly injected into a mold into a desired shape by an injection molding method. The shell 12 has low cost, high efficiency, and is made through a simple process. The shell 12 may also be made of other materials, which is not limited in this embodiment. The sound generating assembly is fixed within the shell 12 and includes a diaphragm that separates the cavity of the acoustic device into a front cavity and a back cavity, wherein the front cavity is in communication with the outside of the acoustic device through the sound outlet 121. The diaphragm vibrates to drive the vibration of the air in the front cavity, and transmits sound waves to the outside of the acoustic device through the sound outlet 121. The shell 12 corresponding to the front cavity and/or the shell 12 corresponding to the back cavity is provided with a sapphire glass 11 which covers the installation hole. As shown in FIGS. 1 and 3, the sound generating assembly includes a vibration assembly 13 and a magnetic circuit assembly 14 which are disposed opposite to each other. Preferably, the vibrating assembly 13 includes a diaphragm, a voice coil 135 and a reinforcement part 134, wherein the diaphragm includes a fixing part 131, a corrugated rim 132, and a central part 133, the central part 133 and the fixing part 131 are connected by the corrugated rim 132, and the fixing part 131 is fixed to the shell 12 to support the central part 133 of the diaphragm to be suspended within the shell 12, and the reinforcement part 134 is attached to the central part 133. The magnetic circuit assembly 14 includes a central magnet 142, a side magnet 143, a magnet yoke 141, and a concentrating flux plate, and the central magnet 142 and the side magnet 143 are both fixed to the magnet yoke 141, leaving a magnetic gap between the central magnet 142 and the side magnet 143.

The magnetic circuit assembly 14 includes one central magnet 142 and two side magnets 143, and the two side magnets 143 are respectively disposed on opposite sides of the central magnet 142. The concentrating flux plate includes one central concentrating flux plate 144 and two side concentrating flux plates 145, and the one central concentrating flux plate 144 is fixed to the one central magnet 142 and each side concentrating flux plate 145 is fixed to each side magnet 143, thus leaving magnetic gaps between the two side magnets 143 and the one central magnet 142. In this way, only two side magnets 143 and two side concentrating flux plates 145 are needed, which can reduce the cost of materials.

Alternatively, the magnetic circuit assembly 14 includes one central magnet 142 and four side magnets 143, and the four side magnets 143 are respectively disposed around the central magnet 142. The concentrating flux plate includes one central concentrating flux plate 144 and four side concentrating flux plates 145, and the one central concentrating flux plate 144 is fixed to the one central magnet 142 and each side concentrating flux plate 145 is fixed to each side magnet 143, thus leaving magnetic gaps between the four side magnets 143 and the one central magnet 142. In this way, it is possible to effectively increase the magnetic field intensity and increase the driving force.

Alternatively, the magnetic circuit assembly 14 includes one central magnet 142 and one ring-shaped side magnet 143, and the central magnet 142 is located in the center of the ring-shaped side magnet 143. The concentrating flux plate includes one central concentrating flux plate 144 and one ring-shaped concentrating flux plate 145, and the one central concentrating flux plate 144 is fixed to the one central magnet 142 and the one ring-shaped side concentrating flux plates 145 is fixed to the one ring-shaped side magnet 143, thus leaving a magnetic gap between the one ring-shaped side magnets 143 and the one central magnet 142. In this way, while increasing the magnetic field intensity, it is possible to reduce the difficulty of assembly, simplify the process of assembly, and improve the efficiency of assembly.

The reinforcing part 134 is located on the side of the diaphragm facing away from the magnetic circuit assembly. The voice coil 135 is fixed on the side of the central part 133 close to the magnetic circuit assembly, is inserted into the magnetic gap, and reciprocates up and down in the magnetic field after being supplied with alternating current, thereby driving the diaphragm and the reinforcing part 134 to vibrate. Since the reinforcing part 134 is located on the side of the diaphragm facing away from the magnetic circuit assembly, it is possible to increase the vibration space in a limited space.

Alternatively, the reinforcing part 134 is located on the side of the diaphragm close to the magnetic circuit assembly. The voice coil 135 is fixed to the reinforcing part 134 or the central part 133, is inserted into the magnetic gap, and reciprocates up and down in the magnetic field after being supplied with alternating current, thereby driving the diaphragm and the reinforcing part 134 to vibrate.

Optionally, the reinforcing part 134 is a polymer material layer structure of polyethylene naphthalate, polyimide or polyethylene terephthalate, and the reinforcing part 134 is a single-layer polymer material layer or a multilayer polymer material layer. The corrugated rim 132 bulges toward the magnetic circuit assembly 14, or bulges toward the sapphire glass 11. In this embodiment, the convex direction of the corrugated rim 132 is not limited, and may be adjusted according to actual demands.

In one embodiment, as shown in FIGS. 1 to 3, the shell 12 corresponding to the front cavity is provided with sapphire glass 11. The sound producing assembly, the shell 12 and the sapphire glass 11 constitute the acoustic device, and the magnetic circuit assembly of the sound producing assembly is exposed to the shell 12. Further, the magnet yoke 141 is fixed to the shell 12 and is provided with a vent channel between the magnet yoke and the shell 12. The space below the diaphragm is in communication with the outside of the acoustic device through the vent channel, that is, the space below the diaphragm is in communication with the space inside the mobile terminal through the vent channel, and the space below the diaphragm and the space inside the mobile terminal together form the back cavity. In this way, it is possible to leave out part of the shell 12 of the acoustic device, simplifying the structure and assembly of the acoustic device, reducing the cost of materials, and further saving the space inside the mobile terminal occupied by the acoustic device. With the same hardness, the sapphire glass 11 may have a thinner thickness. Therefore, under the condition that the overall volume of the acoustic device remains unchanged, the front cavity may have a larger volume, and thus it is possible to improve the acoustic performance. Specifically, the magnet yoke 141 and the shell 12 are at least partially spaced apart, that is, the magnet yoke 141 and the shell 12 are provided with a gap for forming the vent channel, thereby balancing the air pressure on both sides of the magnet yoke 141. Alternatively, the magnet yoke 141 is provided with a vent hole or a vent groove to form the vent channel. In this way, the magnet yoke 141 and the shell 12 do not need to be spaced apart. Alternatively, the shell 12 is provided with the vent hole or the vent groove to balance the air pressure on both sides of the magnet yoke 141, and when using the injection molding technology, the shell 12 may directly form the vent hole or the vent groove. In this way, the process for the injection molded shell 12 is simpler, as compared with providing the vent hole or the vent groove on the magnet yoke 141.

In this embodiment, the shell 12 corresponding to the front cavity is concaved toward the front cavity to form an installation groove 122, with the installation hole being located at the bottom of the installation groove 122 and the sapphire glass 11 being installed into the installation groove 122 and covering the installation hole. The sapphire glass 11 is disposed into the installation groove 122, effectively reducing occupation of internal space of the mobile terminal.

Further, the side of the sapphire glass 11 facing away from the front cavity does not extend beyond a plane where the opening of the installation groove 122 is located, that is, once the sapphire glass 11 is fixed to the installation groove 122, it will not extend beyond the opening of the installation groove 122 in the thickness direction. In this way, it is possible to effectively prevent the sapphire glass 11 from squeezing and abutting against other internal structures of the mobile terminal.

Optionally, the sapphire glass 11 and the shell 12 are fixed by glue. Specifically, the sapphire glass 11 is applied with glue on the bottom, and then bonded and fixed to the shell 12; or, the shell 12 is applied with glue, and then bonded and fixed to the sapphire glass 11; or, the sapphire glass 11 and the shell 12 are both applied with glue, and then bonded and fixed to each other. By means of gluing, the process is simple, the assembly is convenient, and it is possible to effectively reduce the production cost. Wherein, the sapphire glass 11 is attached to the shell 12 and is located outside the shell 12. At this time, the sapphire glass 11 and/or the shell 12 are coated with glue, and then bonded to and fixed to each other; or, the shell 12 is concaved toward the front cavity to form the installation groove 122, the installation hole is located at the bottom of the installation groove 122, the sapphire glass 11 covers the installation hole, and at this time, the sapphire glass 11 and/or the bottom of the installation groove 122 are applied with glue, and then bonded and fixed to each other.

After the sapphire glass 11 and the shell 12 or the bottom of the installation groove 122 are bonded and sealed, it may be waterproof and improve the waterproof performance of the product.

In one embodiment, the sapphire glass 11 has a thickness of 0.1 mm-0.3 mm and a Mohs hardness of 9 (close to the Mohs hardness of 10 of a diamond), which effectively improves the structural strength and stability. Compared with the plastic shell, the sapphire glass 11 may be made thinner and harder, which is conducive to increasing the volume of the front cavity and/or the back cavity so as to improve the acoustic performance.

In another embodiment, the sapphire glass 11 has a thickness greater than 0.3 mm and less than or equal to 0.5 mm, and compared with a ceramic sheet, has a light transmittance of more than 80%. With a high light transmittance, it is more conducive to observing the internal structure, so as to check the problem of the acoustic device. The sapphire glass and the shell 12 may be bonded and fixed by using ultraviolet curing glue (UV glue); and the sapphire glass 11 has a Mohs hardness greater than that of ceramics, and has a higher structural strength.

Optionally, the sapphire glass 11 is at least partially in direct opposition to the sound generating assembly. Furthermore, the sapphire glass 11 is in direct opposition to the sound generating assembly, so that the projection of the sapphire glass 11 in the thickness direction of the sound generating assembly may completely cover the sound generating assembly, which facilitates the observation of the internal structure of the acoustic device through the sapphire glass 11. Since the sapphire glass 11 has an excellent thermal conductivity and is in direct opposition to the sound generating assembly, it is possible to have a more significant thermal conductivity.

In the present disclosure, specifically, the sound outlet 121 is disposed on the side wall of the front cavity corresponding to the shell 12, and may be composed of sapphire glass 11 and the side wall; or, the sound outlet 121 is only disposed on the side wall and runs through the side wall. The diaphragm vibrates to generate sound waves, and the sound waves are transmitted to the outside of the mobile terminal through the sound outlet 121.

The sapphire glass 11 that replaces the original metal steel sheet is light-transmissive and transparent, so that it is convenient for assemblers, maintenance personnel and even consumers to directly observe the inside of the acoustic device through the sapphire glass 11, and it is easier to inspect the product for any problems. For a traditional front cavity structure, the shell structure, such as an injection molding insert and a stamping molding structure, is complicated, and part of the molding process is also complicated. By contrast, the sapphire glass 11 may be directly fixed to the shell 12, which simplifies the structure of the product. When assembling a shell of the existing front cavity, processes such as ultrasound are required. By contrast, when using the sapphire glass 11, it is only necessary to glue it at the bottom thereof and then bond and fix it to the shell 12, which is conducive to improving the aesthetic appearance and greatly reduce the difficulty of assembly. The sapphire glass 11 and/or the shell 12 are applied with ultraviolet curing glue (UV glue) and adhered together, after that, they are irradiated by ultraviolet rays to cure the UV glue so as to be bonded and fixed together, facilitating improvement of the bonding accuracy Most importantly, by replacing the metal steel sheet with sapphire glass 11, it is possible to eliminate interference to the antennas of a terminal such at a 5G mobile phone. By comparison with the metal steel sheet, the sapphire glass 11 has a low dielectric constant, a weak restraint to the field, a correspondingly wide bandwidth, and minor interference on the antenna. The commonly used metal steel sheet has a relatively large dielectric constant, while the sapphire glass 11 has a relatively small dielectric constant, and thus has an extremely small, or even negligible, interference to the antenna. In order to reduce the interference of the metal steel sheet to the antenna, a commonly used metal steel sheet needs to leave a clearance of 1.5 mm between the metal steel sheet and the antenna, and therefore will occupy more internal space of the mobile terminal, while the sapphire glass 11 has a little effect on the antenna, and thus there is no need to provide the original clearance of 1.5 mm, which further reduces the occupation of the internal space of the mobile terminal, and also ensures that the volume of the front cavity will not be reduced.

The voice coil 135 of the acoustic device reciprocates up and down in the magnetic gap after being energized, with its temperature gradually increasing. However, since the sapphire glass 11 is resistant to high temperatures, the heat generated by the sound producing assembly has no significant interference on the strength and stability of the structure of the sapphire glass 11, which ensures the reliability of the acoustic device. The sapphire glass 11 also has good thermal conductivity, and thus the heat generated by the sound producing assembly may be quickly transferred to the outside of the acoustic device through the sapphire glass 11, which reduces the internal temperature of the acoustic device so as to prevent excessive temperature from affecting the structure and performance of the products. In addition, Sapphire glass 11 may also be penetrated by infrared light, have good chemical stability and high hardness. In this way, it is possible to ensure the structural strength of the acoustic device, and to be waterproof after the sapphire glass 11 and the shell 12 are sealed and fixed.

The present disclosure provides an electronic apparatus, that is, the above-mentioned mobile terminal, which is equipped with the acoustic device and antenna in the above embodiments, wherein the acoustic device is located in the shell of the electronic apparatus. The electronic apparatus may be a mobile phone, a tablet computer, a notebook, etc.

Take a mobile phone as an example, since the millimeter wave has a short wavelength, the interference from metal to the antenna of a 5G mobile phone is more obvious and serious. The acoustic device of the present disclosure uses sapphire glass 11 with a small dielectric constant, which has a small impact on the antenna of the 5G mobile phone, and therefore there is no need to set the original clearance area, thereby effectively saving the internal space in the mobile phone.

While certain specific embodiments of the present disclosure have been illustrated by way of example, it will be understood by those skilled in the art that the foregoing examples are provided for the purpose of illustration and are not intended to limit the scope of the present disclosure. It will be understood by those skilled in the art that the foregoing embodiments may be modified without departing from the scope and spirit of the disclosure. The scope of the present disclosure is subject to the attached claims.

The invention claimed is:

1. An acoustic device, comprising:
   a shell provided with an installation hole and a sound outlet;
   a sound producing assembly fixed inside the shell;
   wherein the sound producing assembly has a diaphragm separating a cavity of the acoustic device into a front cavity and a back cavity, wherein the front cavity is in communication with the outside of the acoustic device through the sound outlet, and a first part of the shell corresponding to the front cavity and/or a second part of the shell corresponding to the back cavity is provided with sapphire glass covering the installation hole.

2. The acoustic device of claim 1, wherein the sapphire glass has a thickness of 0.1 mm to 0.3 mm.

3. The acoustic device of claim 1, wherein the sapphire glass has a thickness greater than 0.3 mm and less than or equal to 0.5 mm.

4. The acoustic device of claim 1, wherein the sapphire glass has a Mohs hardness of 9.

5. The acoustic device of claim 1, wherein the sapphire glass has a light transmittance of at least 80%.

6. The acoustic device of claim 1, wherein the first part of the shell corresponding to the front cavity is configured as a concave part toward the front cavity to form an installation groove, wherein the installation hole is located at the bottom of the installation groove, and the sapphire glass is installed inside the installation groove.

7. The acoustic device of claim 6, wherein a first side of the sapphire glass facing away from the front cavity does not extend beyond a plane where the opening of the installation groove is located.

8. The acoustic device of claim 1, wherein the sapphire glass and the shell are fixed by gluing.

9. The acoustic device of claim 8, wherein the sapphire glass and the shell are bonded and fixed with UV glue.

10. An electronic apparatus, comprising:
    a housing and an antenna of the electronic apparatus, and the acoustic device of claim 1.

* * * * *